(12) United States Patent
Chen et al.

(10) Patent No.: US 9,881,857 B2
(45) Date of Patent: Jan. 30, 2018

(54) PAD DESIGN FOR RELIABILITY ENHANCEMENT IN PACKAGES

(71) Applicant: Taiwan Semiconductor Manufacturing Company, Ltd., Hsin-Chu (TW)

(72) Inventors: Jie Chen, New Taipei (TW); Hsien-Wei Chen, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/613,997

(22) Filed: Feb. 4, 2015

(65) Prior Publication Data
US 2015/0364404 A1  Dec. 17, 2015

Related U.S. Application Data

(60) Provisional application No. 62/011,432, filed on Jun. 12, 2014.

(51) Int. Cl.
*H01L 23/498* (2006.01)
*H01L 23/31* (2006.01)
(Continued)

(52) U.S. Cl.
CPC .. *H01L 23/49811* (2013.01); *H01L 23/49838* (2013.01); *H01L 23/5389* (2013.01); *H01L 23/544* (2013.01); *H01L 24/16* (2013.01); *H01L 24/19* (2013.01); *H01L 24/32* (2013.01); *H01L 24/48* (2013.01); *H01L 24/73* (2013.01); *H01L 25/105* (2013.01); *H01L 25/50* (2013.01); *H01L 2223/5442* (2013.01); *H01L 2223/54406* (2013.01); *H01L 2223/54433* (2013.01); *H01L 2223/54486* (2013.01);
(Continued)

(58) Field of Classification Search
CPC . H01L 25/0655; H01L 25/0657; H01L 23/31; H01L 23/3114; H01L 23/49838
See application file for complete search history.

(56) References Cited

U.S. PATENT DOCUMENTS 6,268,568 B1 * 7/2001 Kim .................. H01L 23/49816
    174/250
7,479,705 B2 * 1/2009 Takahashi ......... H01L 23/49838
    257/783
(Continued)

OTHER PUBLICATIONS

Definition of "Corner", http://www.merriam-webster.com/dictionary/corner (2016).*

*Primary Examiner* — Michele Fan
(74) *Attorney, Agent, or Firm* — Slater Matsil, LLP (57) ABSTRACT

A package includes a corner, a device die having a front side and a backside, and a molding material molding the device die therein. A plurality of redistribution lines is on the backside of the device die. The plurality of redistribution lines includes a plurality of metal pads. A polymer layer contacts the plurality of metal pads. A plurality of openings is formed in the polymer layer, with the plurality of metal pads aligned to and exposed to the plurality of openings. The plurality of openings includes a corner opening that is elongated and an additional opening farther away from the corner than the corner opening. The additional opening is non-elongated.

20 Claims, 11 Drawing Sheets

(51) Int. Cl.
*H01L 23/538* (2006.01)
*H01L 23/544* (2006.01)
*H01L 23/00* (2006.01)
*H01L 25/10* (2006.01)
*H01L 25/00* (2006.01)

(52) U.S. Cl.
CPC ........... *H01L 2224/04042* (2013.01); *H01L 2224/04105* (2013.01); *H01L 2224/12105* (2013.01); *H01L 2224/16225* (2013.01); *H01L 2224/32225* (2013.01); *H01L 2224/48091* (2013.01); *H01L 2224/48227* (2013.01); *H01L 2224/73265* (2013.01); *H01L 2224/73267* (2013.01); *H01L 2225/1035* (2013.01); *H01L 2225/1041* (2013.01); *H01L 2225/1058* (2013.01); *H01L 2924/00014* (2013.01); *H01L 2924/14* (2013.01); *H01L 2924/1431* (2013.01); *H01L 2924/1432* (2013.01); *H01L 2924/15311* (2013.01); *H01L 2924/181* (2013.01)

(56) References Cited

U.S. PATENT DOCUMENTS

| | | | |
|---|---|---|---|
| 7,498,196 B2 | 3/2009 | Lee et al. | |
| 7,884,482 B2 | 2/2011 | Ozawa et al. | |
| 8,178,392 B2* | 5/2012 | Choi | H01L 23/49838 257/777 |
| 8,288,871 B1* | 10/2012 | Shieh | H01L 23/49838 257/737 |
| 8,361,842 B2 | 1/2013 | Yu et al. | |
| 8,680,647 B2 | 3/2014 | Yu et al. | |
| 8,703,542 B2 | 4/2014 | Lin et al. | |
| 8,759,964 B2 | 6/2014 | Pu et al. | |
| 8,778,738 B1 | 7/2014 | Lin et al. | |
| 8,785,299 B2 | 7/2014 | Mao et al. | |
| 8,803,306 B1 | 8/2014 | Yu et al. | |
| 8,809,996 B2 | 8/2014 | Chen et al. | |
| 8,829,676 B2 | 9/2014 | Yu et al. | |
| 8,877,554 B2 | 11/2014 | Tsai et al. | |
| 9,233,835 B2* | 1/2016 | Aleksov | H01L 23/49816 |
| 2003/0164554 A1 | 9/2003 | Fee et al. | |
| 2005/0023033 A1* | 2/2005 | Saiki | H05K 3/305 174/260 |
| 2008/0136004 A1* | 6/2008 | Yang | H01L 24/96 257/686 |
| 2008/0185735 A1* | 8/2008 | Pham | H01L 23/49838 257/778 |
| 2008/0217384 A1* | 9/2008 | Jayantha, Sr. | B23K 1/0016 228/180.21 |
| 2011/0006422 A1* | 1/2011 | Daubenspeck | H01L 24/03 257/738 |
| 2011/0108981 A1* | 5/2011 | Rahim | H01L 23/562 257/737 |
| 2011/0235296 A1* | 9/2011 | Shi | H01L 24/14 361/783 |
| 2011/0291288 A1 | 12/2011 | Wu et al. | |
| 2012/0098120 A1* | 4/2012 | Yu | H01L 24/13 257/737 |
| 2013/0026468 A1 | 1/2013 | Yoshimuta et al. | |
| 2013/0062760 A1 | 3/2013 | Hung et al. | |
| 2013/0062761 A1 | 3/2013 | Lin et al. | |
| 2013/0075936 A1* | 3/2013 | Lin | H01L 24/19 257/777 |
| 2013/0105966 A1* | 5/2013 | Kelkar | H01L 24/19 257/737 |
| 2013/0168848 A1 | 7/2013 | Lin et al. | |
| 2013/0307140 A1 | 11/2013 | Huang et al. | |
| 2014/0035156 A1 | 2/2014 | Hsu et al. | |
| 2014/0203429 A1 | 7/2014 | Yu et al. | |
| 2014/0225222 A1 | 8/2014 | Yu et al. | |
| 2014/0247561 A1 | 9/2014 | Inui | |
| 2014/0252646 A1 | 9/2014 | Hung et al. | |
| 2014/0264930 A1 | 9/2014 | Yu et al. | |

\* cited by examiner

PAD DESIGN FOR RELIABILITY ENHANCEMENT IN PACKAGES

PRIORITY CLAIM AND CROSS-REFERENCE

This application claims the benefit of the following provisionally filed U.S. Patent application: Application Ser. No. 62/011,432, filed Jun. 12, 2014, and entitled "Integrated Circuit Package Pad and Method of Forming Same;" which application is hereby incorporated herein by reference.

BACKGROUND

In the packaging of integrated circuits, there are various types of packaging methods and structures. For example, in a conventional Package-on-Package (POP) process, a top package is bonded to a bottom package. The top package and the bottom package may also have device dies packaged therein. By adopting the PoP process, the integration level of the packages is increased.

In an existing PoP process, the bottom package, which includes a device die bonded to a package substrate, is formed first. A molding compound is molded to the package substrate, wherein the device die is molded in the molding compound. The package substrate further includes solder balls formed thereon, wherein the solder balls and the device die are on a same side of the package substrate. The solder balls are used for connecting the top package to the bottom package.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An integrated fan-out package and the structure for improving the reliability of the package are provided in accordance with various exemplary embodiments. The variations of the embodiments are discussed. Throughout the various views and illustrative embodiments, like reference numbers are used to designate like elements.

Figure 1:
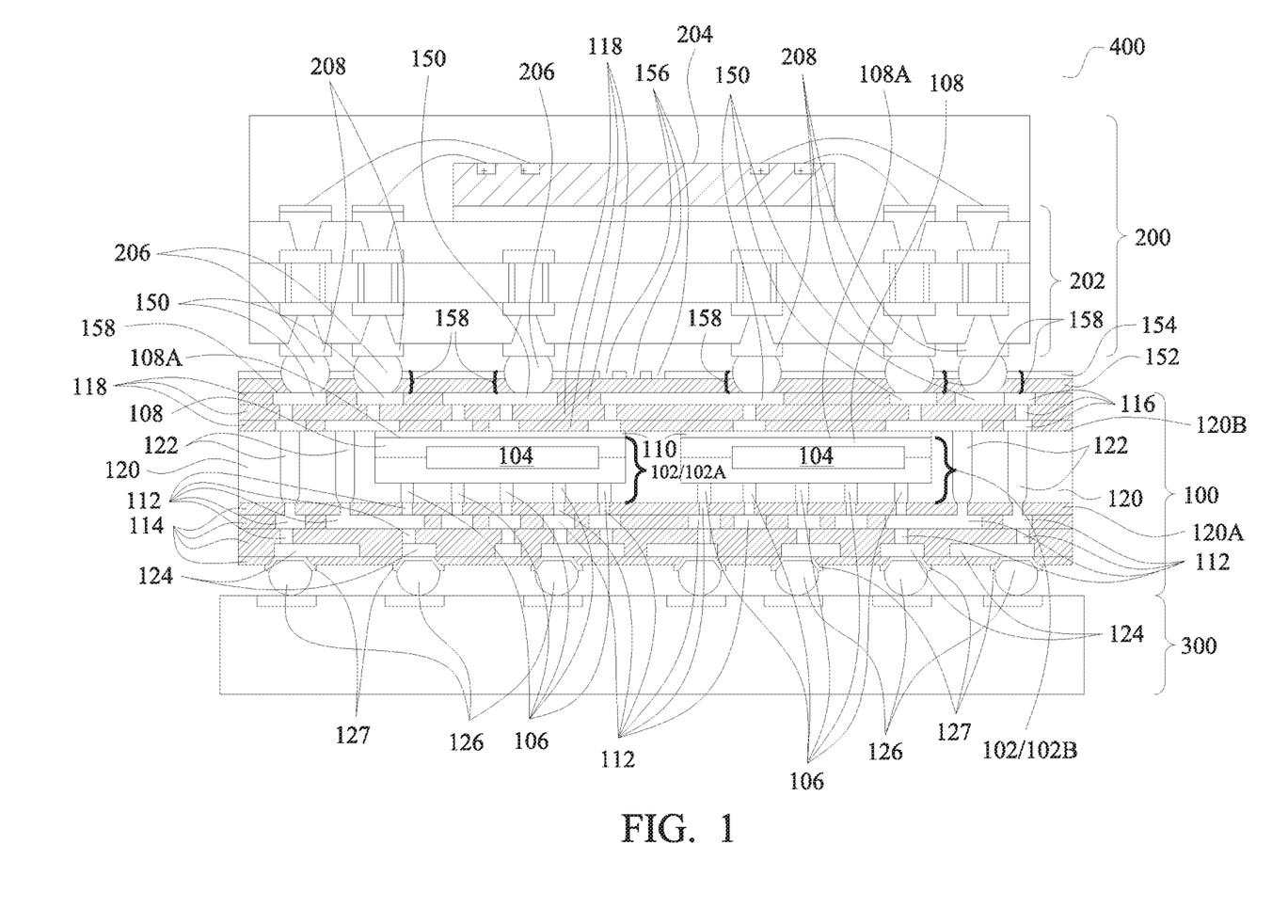
FIG. 1 illustrates a cross-sectional view of a package in accordance with some embodiments.

FIG. 1 illustrates a cross-sectional view of package 400 in accordance with some exemplary embodiments of the present disclosure. Package 400 includes bottom package 100 and top package 200 over and bonded to bottom package 100. Both bottom package 100 and top package 200 are pre-formed, and are then bonded to each other to form a package on package structure. In accordance with some embodiments of the present disclosure, bottom package 100 includes device dies 102 (including 102A and 102B), with the front sides of device dies 102 facing down and bonded to Redistribution Lines (RDLs) 112. In alternative embodiments, bottom package 100 includes a single device die or more than two device dies. Device dies 102 may include semiconductor substrates 108, and integrated circuit devices (such as active devices, which include transistors, for example) 104 at the front surface (the surface facing down) of semiconductor substrates 108. Device dies 102 may include logic dies such as Central Processing Unit (CPU) dies, Graphic Processing Unit (GPU) dies, mobile application dies, or the like.

Device dies 102 are molded in molding material 120, which surrounds device dies 102. Molding material 120 may be a molding compound, a molding underfill, a resin, or the like. The bottom surface 120A of molding material 120 may be leveled with the bottom ends of device dies 102. The top surface 120B of molding material 120 may be level with or higher than back surfaces 108A of semiconductor substrates 108. In accordance with some embodiments of the present disclosure, back surfaces 108A of semiconductor substrates 108 are overlapped by die-attach films 110, which adhere device dies 102 to the overlying dielectric layer 118 and RDLs 116. Device dies 102 further include metal pillars 106 (which may include copper pillars) in contact with, and bonded to, RDLs 112.

Bottom package 100 may include Front-side RDLs 112 underlying device dies 102 and back-side RDLs 116 overlying device dies 102. The term "front-side RDL" indicates that the respective RDLs are on the front side of device dies 102, and the term "back-side RDL" indicates that the respective RDLs are on the back side of device dies 102. Front-side RDLs 112 are formed in dielectric layers 114, and back-side RDLs 116 are formed in dielectric layers 118. RDLs 112 and 116 may be formed of copper, aluminum, nickel, alloys thereof, or multi-layers thereof. In accordance with some embodiments of the present disclosure, dielectric layers 114 and 118 are formed of inorganic materials such as silicon oxide, silicon nitride, silicon oxynitride, or the like. In alternative embodiments, dielectric layers 114 and 118 are formed of organic materials such as polymers, which may include polybenzoxazole (PBO), benzocyclobutene (BCB), polyimide, or the like.

Through-Vias 122 are formed to penetrate through molding material 120. In accordance with some embodiments of the present disclosure, through-vias 122 have top surfaces level with the top surface of molding material 120 and bottom surfaces level with the bottom surface of molding material 120. Through-Vias 122 electrically connect front-side RDLs 112 and device dies 102A and 102B to back-side RDLs 116. Through-Vias 122 may also be in physical contact with some of front-side RDLs 112 and back-side RDLs 116.

Electrical connectors 124, which are formed of a non-solder metallic material(s), are formed at the bottom surface of bottom package 100. In accordance with some embodiments of the present disclosure, electrical connectors 124 are metal pads. In alternative embodiments, electrical connectors 124 include metal pillars such as copper pillars. Throughout the description, electrical connectors 124 are referred to as metal pads 124, although they may have forms other than metal pads. Metal pads 124 may comprise copper, aluminum, nickel, palladium, gold, or multi-layers thereof. Solder regions 126 are attached to the bottom surfaces of metal pads 124 and bond bottom package 100 to package component 300. In some exemplary embodiments, Under Bump Metallurgies (UBMs) 127 are formed at the bottom surface of package component 100, with solder regions 126 attached on. In alternative embodiments, no UBM is formed, and solder regions 126 are in contact with metal pads 124. Package component 300 may include a Printed Circuit Board (PCB), a package, or another type of package component.

The back-side RDLs 116 includes some metal pads 150. In accordance with some embodiments, metal pads 150 are in the topmost RDL layer in package component 100. Polymer layer 152 is formed over RDLs 116 and dielectric layers 118. Dielectric layer 152 may be formed of a polymer such as PBO or other organic or inorganic materials. Throughout the description, dielectric layer 152 is referred to as polymer layer 152 although it may also be formed of a dielectric material other than polymer. In accordance with some embodiments, tape 154 is over and attached to dielectric layer 152. Tape 154 is used to provide protection and reinforcement to the underlying structure. Furthermore, laser marks 156 may be formed in tape 154. Laser marks 156 are recesses/openings in tape 154 and may be formed through laser. The top-view shape of laser marks 156 may include letters, numbers, graphics, and/or the like. Hence, laser marks 156 may be used for identification purposes. In alternative embodiments, tape 154 is not formed, and polymer layer 152 is the top layer of package component 100.

Openings 158 are formed in polymer layer 152 and tape 154, and metal pads 150 are exposed to opening 158. Solder regions 206 have their bottom portions filling openings 158, with solder regions 206 in contact with metal pads 150.

Top package 200 is bonded to bottom package 100. In accordance with some embodiments of the present disclosure, top package 200 includes package substrate 202 and device die 204, which is bonded to package substrate 202. The bonding of device die 204 to package substrate 202 may be achieved through wire bonding, flip-chip bonding, or the like. Solder regions 206 bond top package 200 to bottom package 100. Furthermore, solder regions 206 are in contact with metal pads 208 at the bottom surface of package component 200. Accordingly, solder regions 206 have their top surface in contact with metal pads 208 and bottom surfaces in contact with the top surfaces of metal pads 150.

Figure 2:
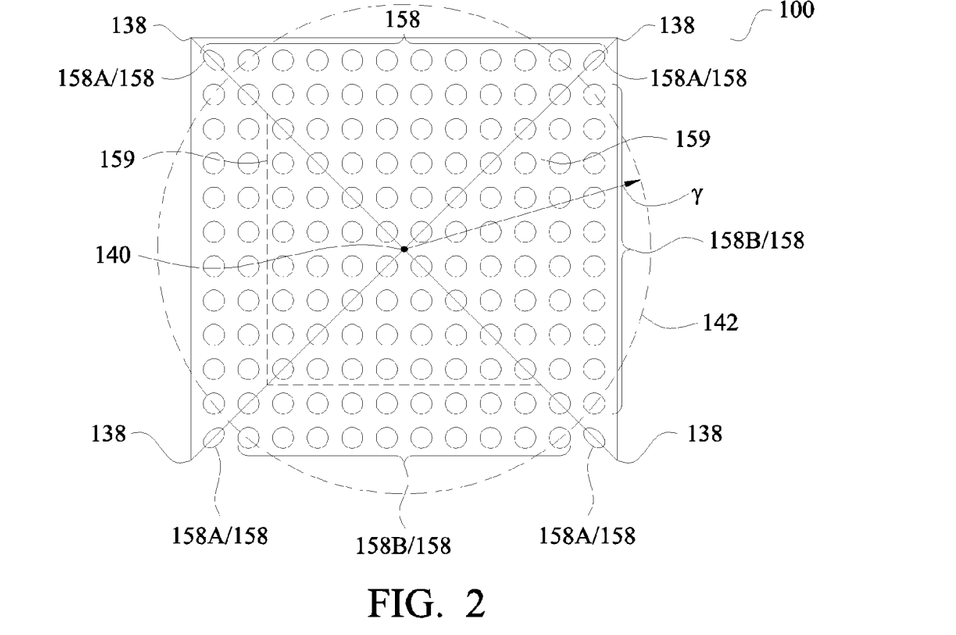
FIG. 2 illustrates the top view of a package and openings in a top dielectric layer of the package in accordance with some embodiments, wherein corner openings are elongated connectors.

FIG. 2 illustrates a schematic top view of portions of bottom package 100, wherein openings 158 in polymer layer 152 (and tape 154, if any, FIG. 1) are illustrated. Openings 158 include elongated openings 158A and non-elongated openings 158B. In FIGS. 2 through 9, circles are used to schematically represent non-elongated openings 158B, and ovals are used to schematically represent elongated openings 158A. FIGS. 10A and 10B illustrate a top view of some exemplary elongated opening 158A. Elongated opening 158A has length L1 measured in lengthwise direction X and width W1 measured in widthwise direction Y, which is perpendicular to lengthwise direction X. Length L1 is greater than width W1. Elongated opening 158A includes longer axis 134 in lengthwise direction X and shorter axis 136 in widthwise direction Y. Throughout the description, an elongated opening 158A is an opening whose length-to-width ratio L1/W1 is greater than threshold ratio Lt that is greater than 1. Threshold ratio Lt may be greater than about 1.2, 1.6, or 2.0.

Elongated opening 158A may have various shapes including, but not limited to, an oval shape, a rectangular shape, an elongated octagonal shape, or the like. For example, FIG. 10A illustrates an exemplary elongated opening 158A, which includes two half circles 130 connected to opposite edges of rectangle 128. FIG. 10B illustrates an elongated hexagon. It is appreciated that other elongated shapes other than what have been discussed may also be used.

Figure 11A:
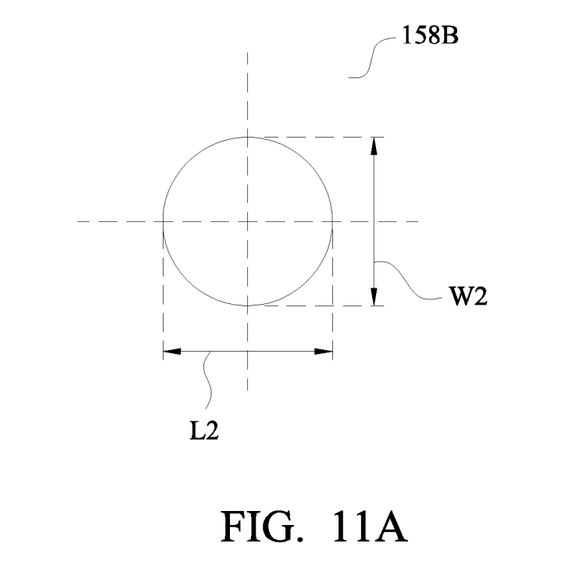
FIGS. 11A and 11B illustrate top views of some exemplary non-elongated openings in accordance with some embodiments.
Figure 11B:
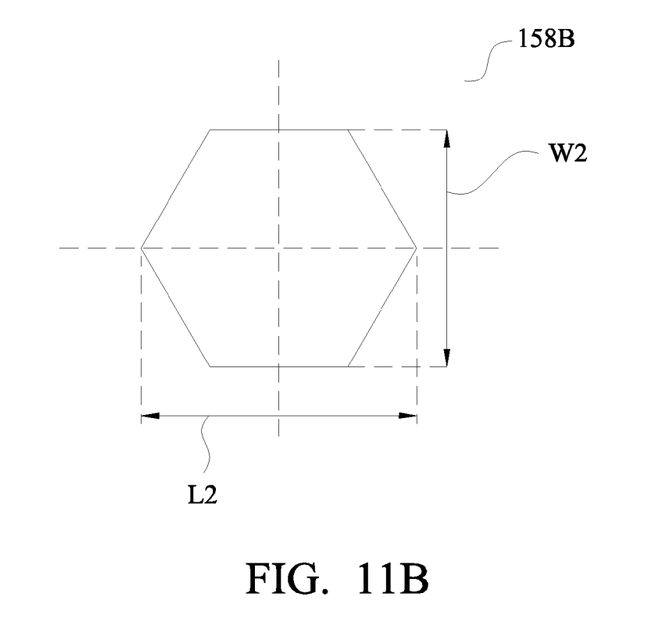

FIGS. 11A and 11B illustrate the top views of exemplary non-elongated openings 158B. Throughout the description, a non-elongated opening 158B does not have length L2 and width W2 observably different from each other. Alternatively, a non-elongated opening 158B has width W2 smaller than length L2, with length-to-width ratio L2/W2 being smaller than the threshold ratio Lt, which may be smaller than about 1.2 or about 1.1 in accordance with some exemplary embodiments. For example, FIGS. 11A and 11B illustrate non-elongated openings 158B, which have a circular bottom-view shape and a hexagonal bottom-view shape, respectively.

Although not shown in FIGS. 10A, 10B, 11A, and 11B, the top views of solder regions 206 (FIG. 1) are defined by, and may be the same as, the top-view shapes of the respective underlying openings 158. Hence, solder regions 206 may also include elongated solder regions (in the top view of package component 100) and non-elongated solder regions.

Referring back to FIG. 2, bottom package 100 includes four corners 138. The corner openings 158, which are closer to the respective corners 138 than all other openings, are elongated openings 158A. Other openings 158 that are farther away from the respective corners 138 than the corner openings 158A are non-elongated openings 158B. In accordance with some embodiments of the present disclosure, there may be more than one elongated opening 158A at each corner 138. For example, as shown in FIG. 3, there are three elongated openings 158A at each corner 138.

Figure 3:
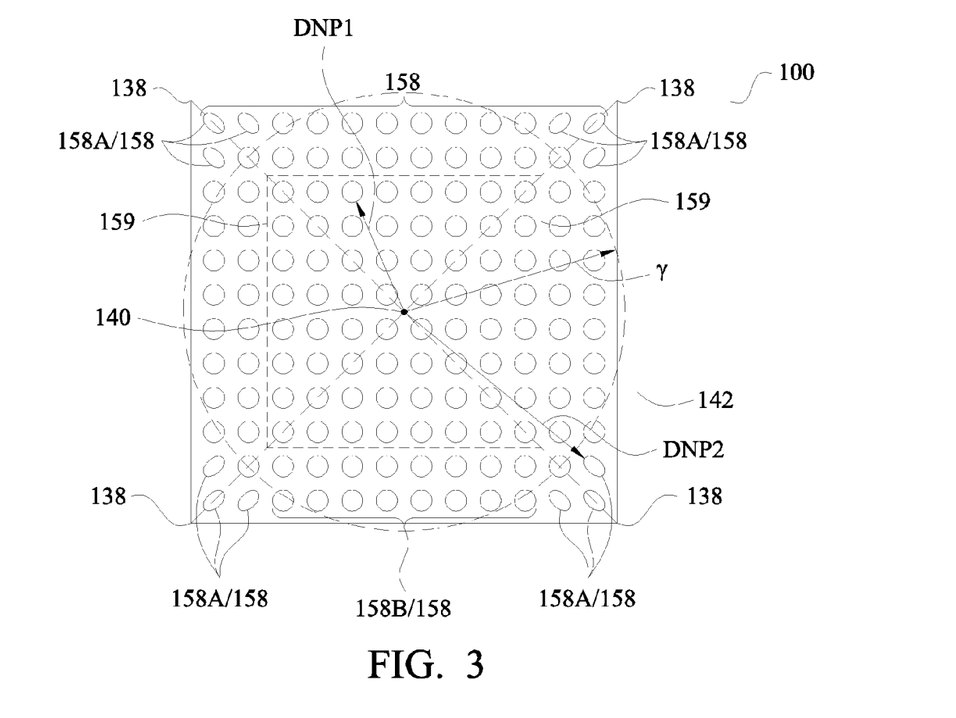
FIG. 3 illustrates the top view of a package and openings in a top dielectric layer of the package in accordance with some embodiments, wherein a plurality of elongated openings is distributed to each corner.
Figure 4:
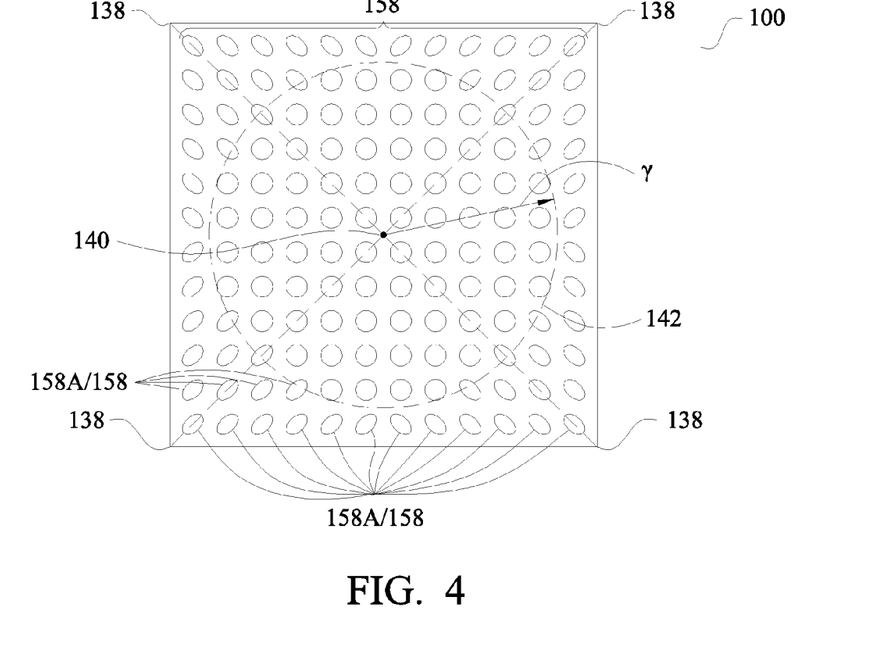
FIG. 4 illustrates the top view of a package and non-solder openings of the package in accordance with some embodiments, wherein elongated openings and non-elongated openings are distributed depending on their distances to a neutral-stress point of the package.

FIGS. 3 and 4 illustrate the top views of bottom package 100 and openings 158 in accordance with alternative embodiments. In the top view, bottom package 100 has neutral-stress point 140, which is the point substantially free from stresses from all lateral directions that are parallel to the bottom surface of package 100. At neutral-stress point 140, the lateral stresses from opposite directions are cancelled out. The lateral stresses are the stresses parallel to the top and bottom surfaces of package component 100 in FIG. 1. In accordance with some embodiments of the present disclosure, neutral-stress point 140 is at or close to the center of bottom package 100 (in the top view). The distance between each of openings 158 and neutral-stress point 140 is referred to as a Distance to Neutral Point (DNP) of the respective opening 158, wherein the distance of an opening 158 is measured from a point of the opening 158 that is closest to neutral-stress point 140. For example, DNPs DNP1 and DNP2 are illustrated as examples in FIG. 3.

As shown in FIGS. 3 and 4, a circle 142 is drawn with neutral-stress point 140 as the center, wherein circle 142 has radius r. In accordance with the embodiments of the present disclosure, all openings 158 with DNPs equal to or smaller than radius r are designed as non-elongated openings 158B, and all openings 158 with DNPs greater than radius r are designed to be elongated openings 158A. As illustrated in FIG. 3, if radius r is large, then the elongated openings include corner openings. In these embodiments, each row includes at least one (or more) opening that is a non-elongated opening. In FIG. 4, radius r is reduced, and hence an entire edge-row or edge-column of openings 158 whose DNPs are greater than radius r are elongated, while the openings 158 with the DNPs equal to or smaller than radius r are non-elongated. In the embodiments in FIGS. 3 and 4, the elongated openings 158A include corner openings.

Radius r is determined based on the stresses suffered by solder regions 206 and metal pads 150 (FIG. 1) and may be based on measurement results from packages and/or simulation results. In some embodiments, radius r is selected by ensuring the stresses suffered by all solder regions 206 and metal pads 150 in circle 142 (FIGS. 3 and 4) are lower than a pre-determined threshold stress, while the stresses suffered by at least some solder regions 206 and metal pads 150 outside circle 142 are higher than the threshold stress.

Figure 5:
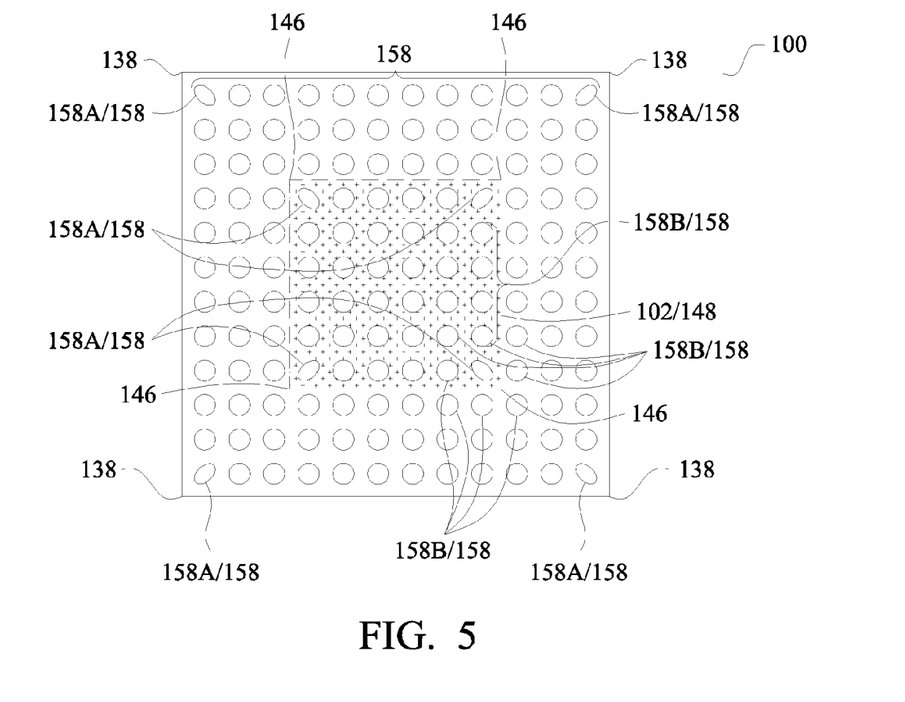
FIG. 5 illustrates a top view of a package and openings in a top dielectric layer of the package in accordance with some embodiments, wherein inner openings adjacent to the corners of an underlying device die are elongated.

In accordance with some embodiments, openings 158 are distributed as an array that is distributed throughout package 100, as shown in FIGS. 3 through 5. In alternative embodiments, openings 158 are distributed close to the peripheral regions of package 100, and are not in the inner regions. For example, FIGS. 2 and 3 schematically illustrate dashed rectangular regions 159. In these embodiments, openings 158 will be formed outside of rectangular regions 159, and will not be formed inside rectangular regions 159.

FIG. 5 illustrates the top view of some components in bottom package 100 and openings 158 in accordance with yet alternative embodiments. Device die 102 is illustrated in the top view. Device die 102 includes corners 146. Solder regions that are close to the corners 146 suffer from higher stresses than other nearby solder regions and hence are more prone to failure. In accordance with some embodiments of the present disclosure, the inner openings 158 (which are not edge openings and not corner opening of package 100) that overlap (also refer to FIG. 1) device die 102 and are also closest to corners 146 are elongated openings 158A, while other openings 158 (except the openings 158A discussed in the embodiments in FIGS. 2 through 4) are non-elongated openings 158B. In accordance with some embodiments of the present disclosure, the inner elongated openings 158A are surrounded by non-elongated openings 158B.

Figure 6:
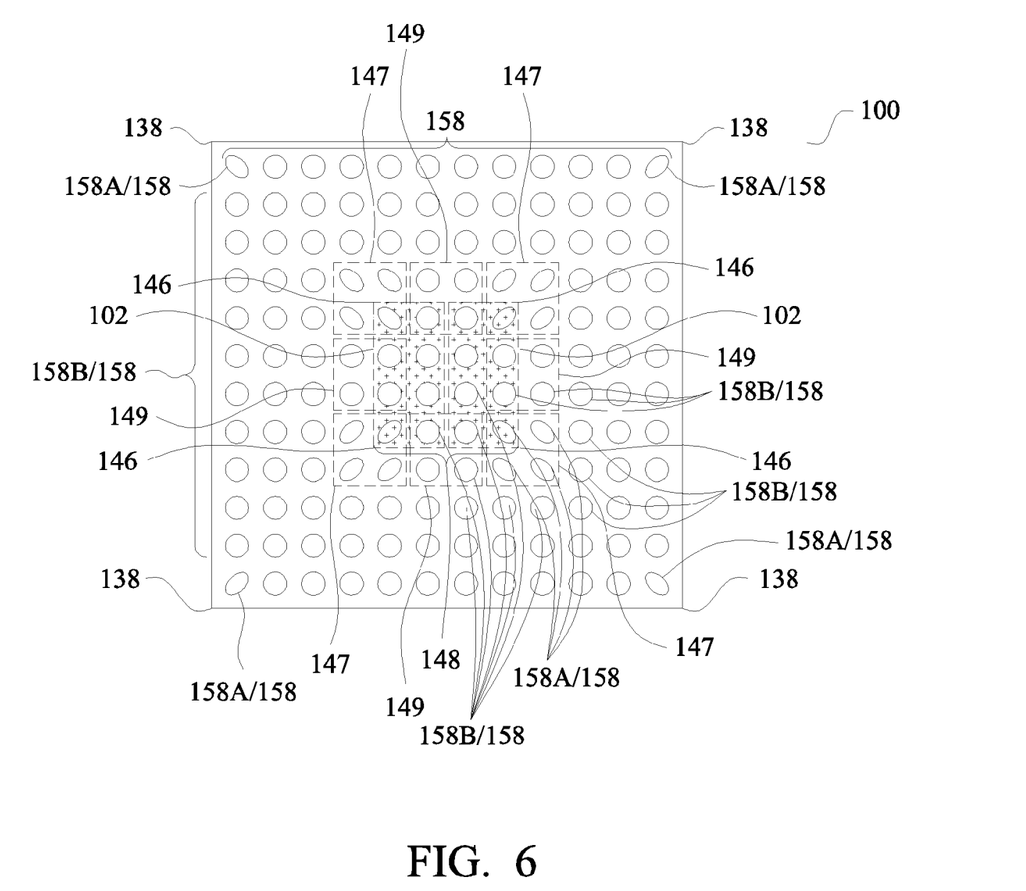
FIG. 6 illustrates the top view of a package and openings in a top dielectric layer of the package in accordance with some embodiments, wherein inner openings adjacent to the corners of an underlying device die group are elongated.

FIG. 6 illustrates some components in the top view of bottom package 100 and openings 158 in accordance with yet alternative embodiments. In these embodiments, a plurality of device dies 102 is closely located from each other to form device die group 148. Device die group 148 includes corners 146. In accordance with some embodiments of the present disclosure, there are four corner regions 147, each at a corner 146. There are four openings 158 in each of corner regions 147, wherein the four openings 158 are closest to the respective corner 146. Each of the four openings 158 in each corner region 147 includes one opening that overlaps die group 148 and three openings 158 that do not overlap die group 148. All four openings 158 in each corner region 147 are elongated openings 158A, while other openings 158 in the regions surrounding each of corner regions 147 are non-elongated openings 158B.

There is also a plurality of edge regions 149 that overlaps the edges of die group 148. In each of edge regions 149, there are two rows of openings 158, with each of the two rows extending in the direction parallel to the respective edge of die group 148. One of the rows of openings 158 overlaps die group 148, and the other row of openings 158 does not overlap die group. In accordance with some embodiments of the present disclosure, edge openings 158 in edge regions 149 are non-elongated openings 158B. In alternative embodiments, edge openings 158 in edge regions 149 are elongated openings 158A.

In accordance with some embodiments as shown in FIGS. 5 and 6, the inner openings 158 that are overlapped by device die group 148, whose openings 158 are also closest to corners 146, are elongated openings 158A, while other openings 158 (except the openings 158A discussed in the embodiments in FIGS. 2 through 4) are non-elongated openings 158B. In accordance with some embodiments of the present disclosure, the inner elongated openings 158A are surrounded by non-elongated openings 158B.

In the above-discussed embodiments referring to FIG. 6, die group 148 includes two dies. In alternative embodiments, die group 148 may include a single die or more than two dies. For example, as shown in FIG. 5, when die group 148 includes a single die, then the die corners 146 as in FIG. 6 will be the four corners of the single die.

Figure 7:
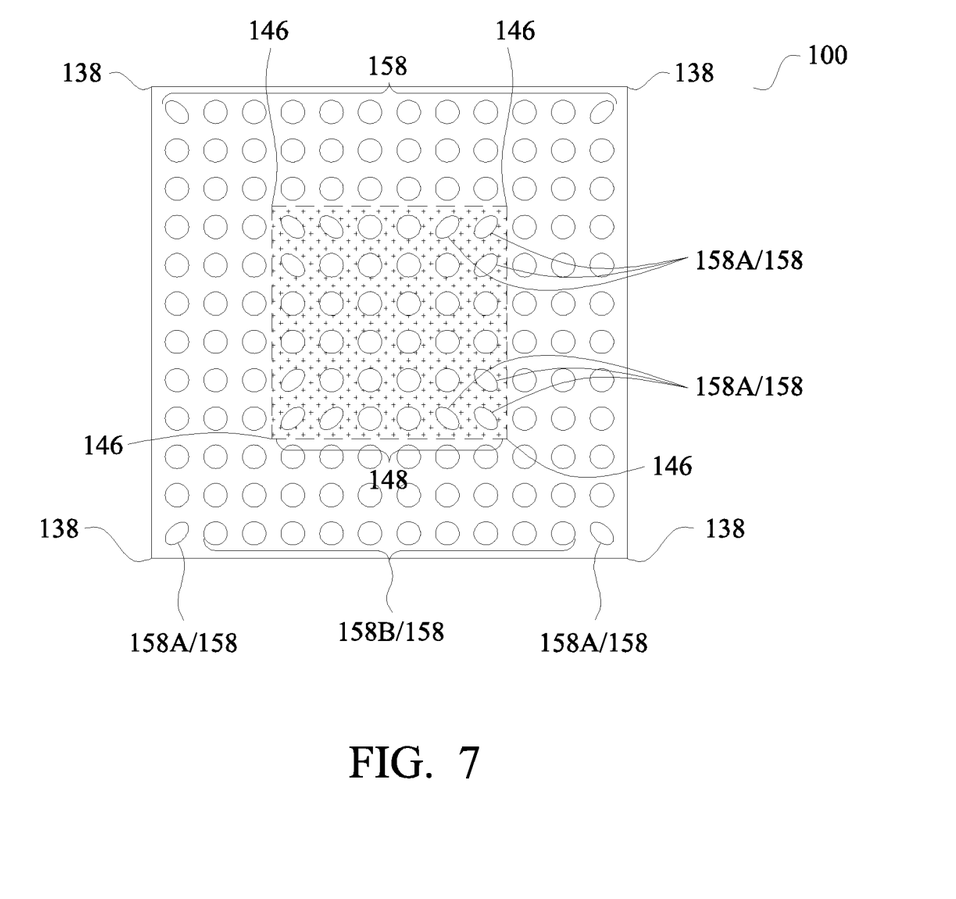
FIG. 7 illustrates the top view of a package and openings in a top dielectric layer of the package in accordance with some embodiments, wherein a plurality of inner openings adjacent to each corner of an underlying device die is elongated.
Figure 8:
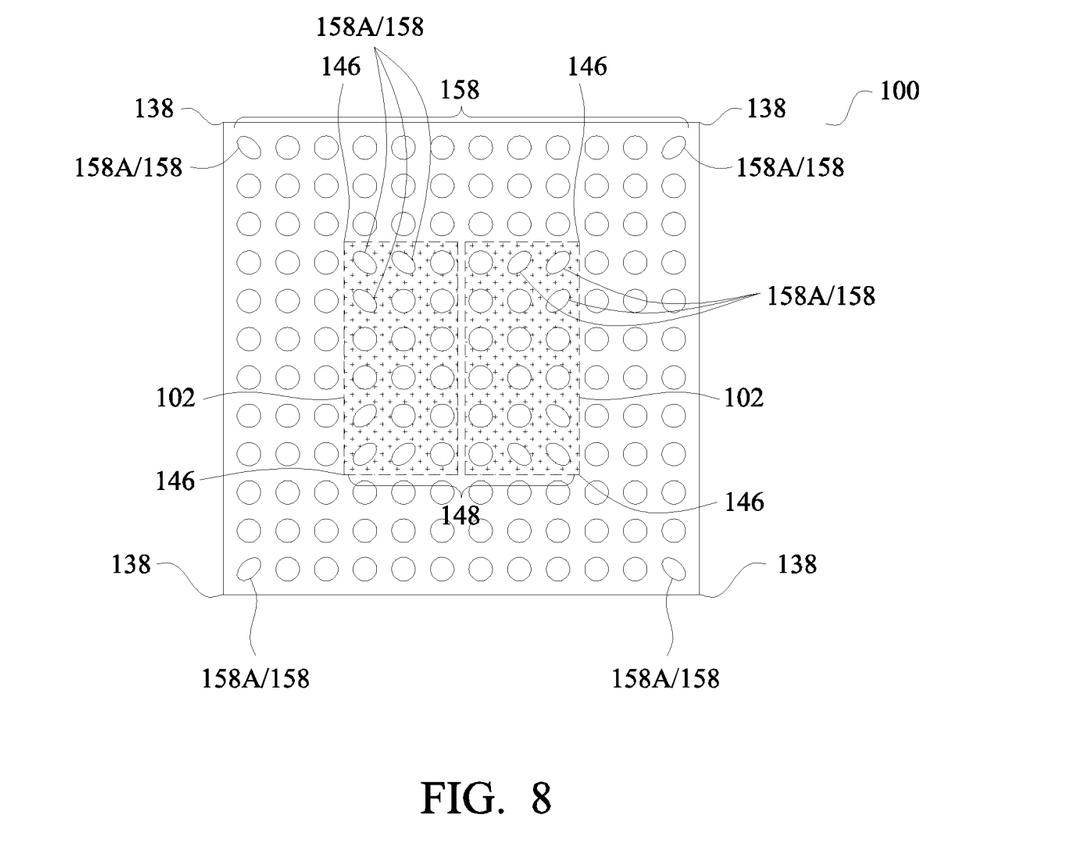
FIG. 8 illustrates the top view of a package and openings in a top dielectric layer of the package in accordance with some embodiments, wherein a plurality of inner openings adjacent to each corner of an underlying device die group is elongated.

FIGS. 7 and 8 illustrate the top views of bottom package 100 and openings 158 in accordance with yet alternative embodiments. These embodiments are similar to the embodiments in FIGS. 5 and 6 except that more openings 158 that are close to the corners 146 of, and overlaps, device dies 102 or device die group 148 are elongated openings 158A, which are surrounded by non-elongated openings 158B. Furthermore, FIG. 7 illustrates a single device die 102, with elongated openings 158A being distributed close to the corners 146 of device die 102. FIG. 8 illustrates a device die group 148, with elongated openings 158A being distributed close to the corners 146 of device die group 148. In accordance with some embodiments in FIGS. 5 through 8, an inner elongated opening 158A may be fully, or partially, overlapped by the overlying device die 102 or device die group 148.

Figure 9:
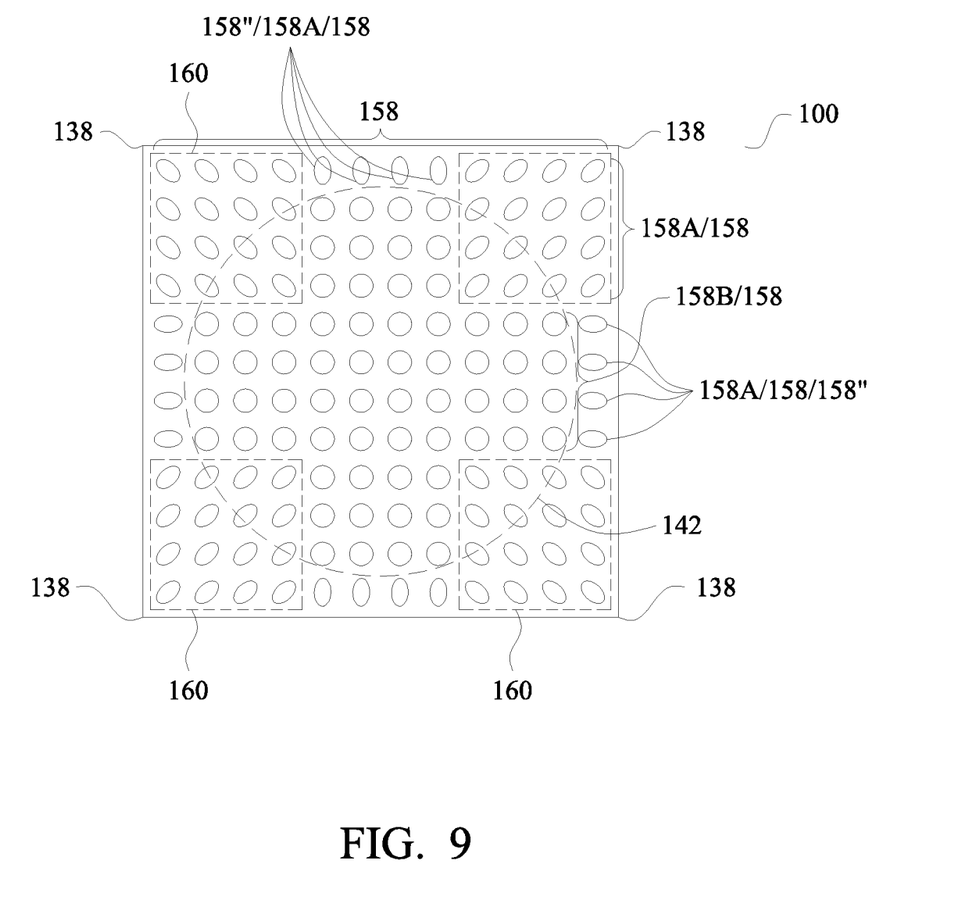
FIG. 9 illustrates the top view of a package and openings in a top dielectric layer of the package in accordance with some embodiments, wherein openings in corner rectangular regions are elongated.
Figure 10A:
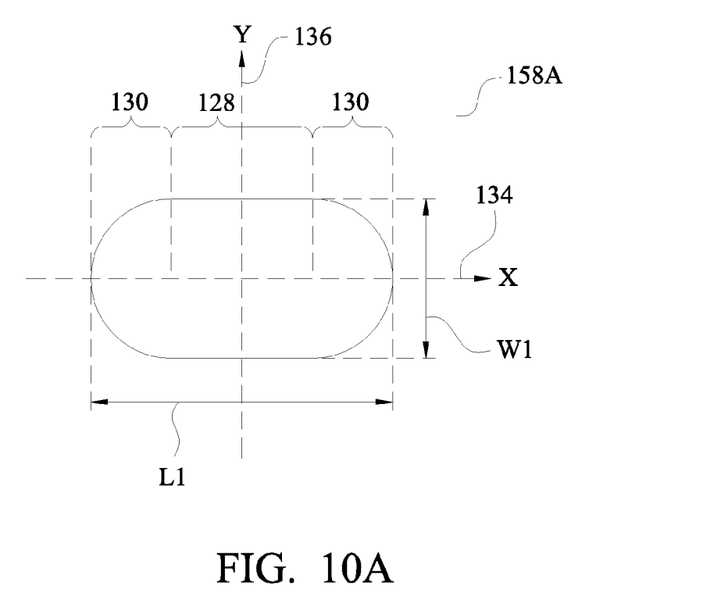
FIGS. 10A and 10B illustrate top views of some exemplary elongated openings.
Figure 10B:
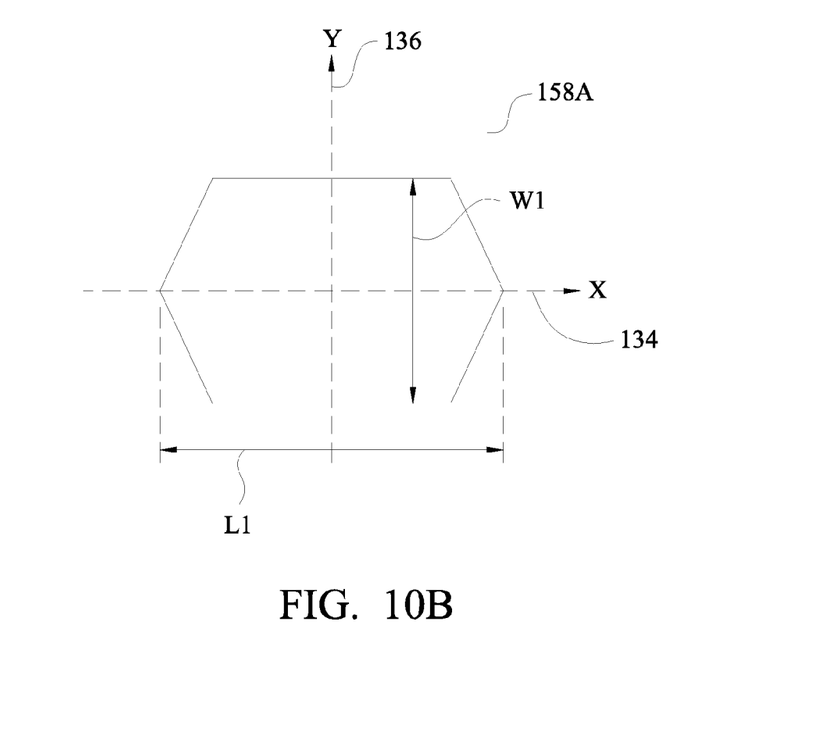

FIG. 9 illustrates the design of openings 158 in accordance with yet alternative embodiments. In these embodiments, four corner regions 160 of bottom package 100 are defined, each extending from one of corners 138 inwardly. The four corner regions 160 may have rectangular shapes and may have sizes the same as each other. The openings 158 inside corner regions 160 are designed as elongated opening 158A. The openings 158 outside corner regions 160 may be designed as non-elongated openings 158B or may be designed as elongated opening 158A.

In some embodiments as in FIG. 9, circle 142 is also drawn according to simulation or experiment results. The radius of circle 142 may be small, and hence some of openings 158 that are outside of corner regions 160 are also outside of circle 142. Accordingly, as shown in FIG. 6, some of openings 158 (marked as 158") that are outside of the circle 142 are also elongated openings 158A, while the openings 158 that are outside of corner regions 160, but inside circle 142, are non-elongated openings 158B.

Figure 12A:
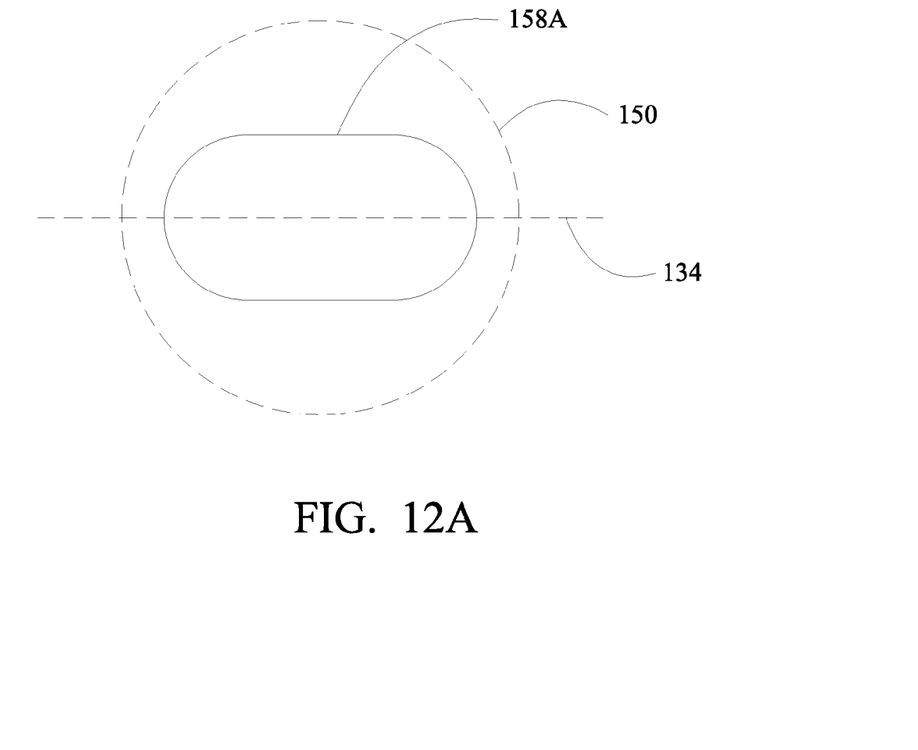
FIGS. 12A and 12B illustrate the exemplary shapes of elongated openings and their respective underlying metal pads in accordance with some embodiments.
Figure 12B:
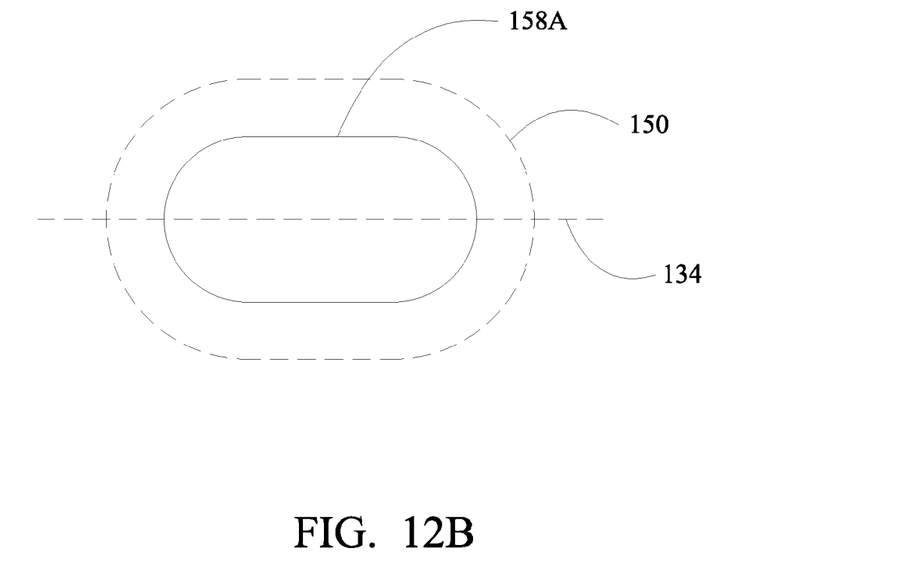

FIGS. 12A and 12B illustrate the top views of some exemplary elongated openings 158A and the respective metal pad 150 (also refer to FIG. 1) that are underlying and in contact with the elongated openings 158A. In accordance with some embodiments, metal pad 150 has a non-elongated shape such as a circle (as shown in FIG. 12A), a square, a hexagon, an octagon, or the like. In alternative embodiments, as shown in FIG. 12B, metal pad 150 may also have an elongated shape that fits the shape of the respective elongated opening 158A. Furthermore, the long axis of metal pad 150 may be parallel to, and may overlap, the long axis of the respective elongated opening 158A. By designing metal pad 150 to be elongated, the reliability of the respective package may be further improved.

Figure 13:
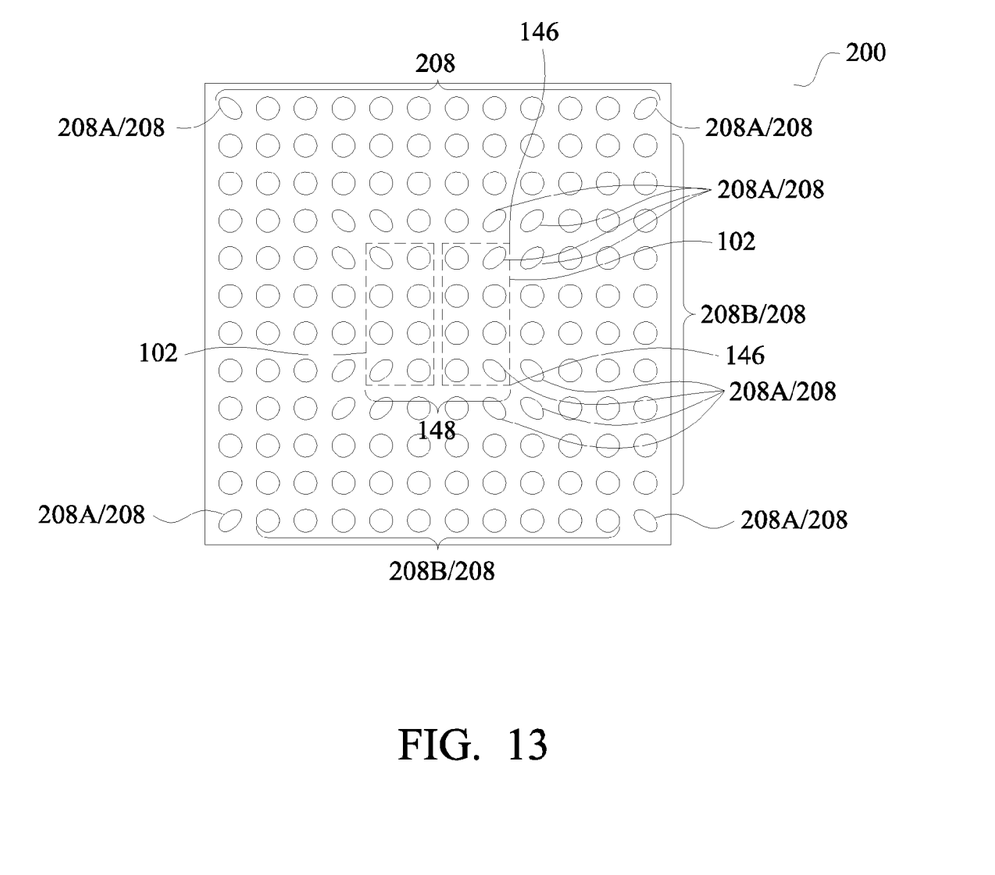
FIG. 13 illustrates the metal pads on a package that is bonded to the package with elongated openings.

In the above-discussed embodiments, openings 158 include elongated openings 158A and non-elongated openings 158B. As shown in FIG. 1, openings 158 (including elongated openings 158A and non-elongated openings 158B) are bonded to metal pads 208 through solder regions 206. To fit the shapes of elongated openings 158A and non-elongated openings 158B, metal pads 208 in package component 200 may also be designed to have elongated metal pads 208A overlapping and bonded to elongated openings 158A and elongated metal pads 208B overlapping and bonded to non-elongated openings 158B. An exemplary bottom view of metal pads 208A and 208B are schematically illustrated in FIG. 13. In accordance with some embodiments of the present disclosure, each of the elongated openings 158A in FIGS. 2 through 9 corresponded to, and are overlapped by and bonded to, the respective overlying elongated metal pads 208A, and each of the non-elongated openings 158B in FIGS. 2 through 9 corresponded to, and are overlapped by, the respective overlying non-elongated metal pads 208B. The bottom shapes of elongated metal pads 208A and non-elongated metal pads 208B and their respective positions are similar to the shape of the corresponding elongated openings 158A and non-elongated openings 158B in FIGS. 2 through 9, and hence are not illustrated.

Throughout the embodiments of the present disclosure, as shown in FIGS. 2 through 9, elongated openings 158A are centripetal. In accordance with some embodiments, the longer axis 134 (FIGS. 10A and 10B) of elongated centripetal openings 158A extend toward the neutral-stress point 140 (FIGS. 2 through 4), which may be at, or at least close to, the center of bottom package 100 (in the top view). Alternatively stated, the longer axis 134 (FIGS. 10A and 10B) of the centripetal elongated openings 158A pass through the center of bottom package 100, or at least, the longer axis 134 of the centripetal elongated openings 158A are closer to the center of bottom package 100 than the respective shorter axis 136.

The embodiments of the present disclosure have some advantageous features. By designing centripetal elongated openings, the solder regions in the centripetal elongated openings can endure higher stresses without failure than the solder regions in non-elongated openings. The locations of the centripetal elongated openings are selected according to the stresses suffered by the solder regions. Simulation results indicated that when the corner openings of the bottom package 100 are centripetal elongated openings, the respective package fails after 769 thermal cycles in the reliability test. In comparison, when the corner openings of the bottom package 100 are non-elongated openings, the respective package fails after 604 thermal cycles. When the corner openings of the bottom package 100 are elongated openings with the widthwise directions extending toward the neutral-stress point, the respective bottom package fails after 574 thermal cycles. These results indicate that a package with centripetal elongated openings have improved reliability and can endure more thermal circles before they fail.

In accordance with some embodiments of the present disclosure, a package includes a corner, a device die having a front side and a backside, and a molding material molding the device die therein. A plurality of redistribution lines is on the backside of the device die. The plurality of redistribution lines includes a plurality of metal pads. A polymer layer contacts the plurality of metal pads. A plurality of openings is disposed in the polymer layer, with the plurality of metal pads aligned to and exposed to the plurality of openings. The plurality of openings includes a corner opening that is elongated and an additional opening farther away from the corner than the corner opening. The additional opening is non-elongated.

In accordance with alternative embodiments of the present disclosure, a package includes at least one first dielectric layer, a first plurality of redistribution lines in the at least one first dielectric layer, a device die over and electrically coupled to the first plurality of redistribution lines, a molding material molding the device die therein, a through-via penetrating through the molding material, at least one second dielectric layer over the device die, and a plurality of metal pads over the molding material. The plurality of metal pads is electrically coupled to the through-via and the device die. A polymer layer is over the plurality of metal pads. A plurality of openings is in the polymer layer, wherein the plurality of openings includes an elongated opening and a non-elongated opening. A plurality of solder regions extends into the plurality of openings to contact a respective one of the plurality of metal pads.

In accordance with yet alternative embodiments of the present disclosure, a package includes a device die, a through-via coplanar with the device die, and a molding material molding the first device die and the through-via therein. A plurality of metal pads is disposed on a side of the molding material and electrically coupled to the device die and the through-via. A polymer is in contact with the plurality of metal pads. A plurality of openings is in the polymer and aligned to the plurality of metal pads. The plurality of openings includes a corner opening that is elongated and centripetal, and an inner opening that is elongated and centripetal. The plurality of openings further includes a plurality of non-elongated openings surrounding the inner opening. A plurality of solder regions is disposed in the plurality of openings. A package is bonded to the plurality of metal pads through the plurality of solder regions.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package comprising:
 a first package comprising:
  a corner;
  a first device die comprising a front side and a backside;
  a molding material molding the first device die therein;
  a plurality of redistribution lines on the backside of the first device die, wherein the plurality of redistribution lines comprises a plurality of metal pads; and
  a polymer layer contacting the plurality of metal pads; and
  a plurality of openings in the polymer layer, with the plurality of metal pads aligned to and exposed to the plurality of openings, wherein the plurality of openings comprises:
   a corner opening adjacent to the corner, wherein the corner opening is elongated;
   an opening farther away from the corner than the corner opening, wherein the opening is non-elongated;
   an inner elongated opening adjacent to a corner of the first device die, wherein the polymer layer overlies the first device die, and the inner elongated opening does not overlap the first device die; and
   a plurality of non-elongate openings surrounding the inner elongated opening.

2. The package of claim 1, wherein at each of corners of the first package, there is an elongated one of the plurality of openings.

3. The package of claim 1 further comprising a second device die in the molding material, with the first device die and the second device die forming a die group, wherein inner corners of the first device die and second device die inside the die group have no adjacent elongated openings in the polymer layer.

4. The package of claim 1, wherein the first package has a neutral-stress point in a top view of the first package, wherein all openings in the plurality of openings and having Distances to Neutral Point (DNPs) greater than a radius are elongated, and wherein all openings in the plurality of openings and having DNPs equal to or smaller than the radius are non-elongated.

5. The package of claim 1, wherein the corner opening is one of openings closest to the corner of the first package.

6. The package of claim 1 further comprising:
 a second package; and
 a solder region bonding the first package to the second package.

7. The package of claim 6, wherein the second package comprises an additional metal pad in contact with the solder region, wherein the additional metal pad is elongated.

8. The package of claim 6, wherein the plurality of metal pads comprises an elongated metal pad, with the solder region contacting the elongated metal pad, and wherein a first long axis of the corner opening is parallel to a second long axis of the elongate metal pad.

9. A package comprising:
 at least one first dielectric layer;
 a first plurality of redistribution lines in the at least one first dielectric layer;
 a device die over and electrically coupled to the first plurality of redistribution lines;
 a molding material molding the device die therein;
 a through-via penetrating through the molding material;
 at least one second dielectric layer over the device die;
 a plurality of metal pads over the molding material, wherein the plurality of metal pads is electrically coupled to the through-via and the device die;
 a polymer layer over the plurality of metal pads;
 a plurality of openings in the polymer layer, wherein the plurality of openings comprises:
  a first elongated opening and a non-elongated opening, wherein the first elongated opening is surrounded by non-elongated openings, with the first elongated opening being on an inner side of the non-elongated openings; and
  a second elongated opening in the polymer layer, wherein the second elongated opening is a corner opening closest to a corner of the package; and
 a plurality of solder regions, each extending into one of the plurality of openings to contact a respective one of the plurality of metal pads.

10. The package of claim 9, wherein all corner openings in the plurality of openings closest to respective corners of the package are elongated.

11. The package of claim 9, wherein the first elongated opening is centripetal, with a lengthwise direction of the first elongated opening extending toward a center of the package.

12. The package of claim 9 further comprising a second elongated opening, wherein the second elongated opening is adjacent to a corner of the device die in a top view of the package, wherein the second elongated opening does not overlap the device die.

13. The package of claim 9, wherein at least one of the non-elongated openings overlaps the device die.

14. The package of claim 9, wherein all openings in the polymer layer and immediately neighboring the first elongated opening are non-elongated.

15. A package comprising:
 a first device die;
 a through-via coplanar with the first device die;

a molding material molding the first device die and the through-via therein;

a plurality of metal pads on a side of the molding material and electrically coupled to the first device die and the through-via;

a polymer layer in contact with the plurality of metal pads;

a plurality of openings in the polymer layer and aligned to the plurality of metal pads, wherein the plurality of openings comprises:

a corner opening, wherein the corner opening is closest to a corner of the package among all openings in the polymer layer, with the corner being at an intersection of two outmost edges of the package, wherein the corner opening is elongated;

a first inner opening, wherein the first inner opening is elongated, and wherein the corner opening and the first inner opening are centripetal; and     a plurality of non-elongated openings surrounding the first inner opening, wherein an edge row of the plurality of openings includes a non-elongated opening, with the edge row being a row closest to an edge of the first device die than other rows;

a plurality of solder regions in the plurality of openings; and a package bonded to the plurality of metal pads through the plurality of solder regions.

16. The package of claim 15 further comprising a second inner opening among the plurality of openings, wherein the second inner opening is immediately next to, and is surrounded by, the plurality of non-elongated openings, with the second inner opening being elongated.

17. The package of claim 15, wherein the first inner opening comprises a portion aligned to at least a part of the first device die.

18. The package of claim 15 further comprising a second device die in the molding material, wherein the first device die and the second device die are in a die group, and wherein each of corners of the die group is adjacent to an elongated opening that is among the plurality of openings, with inner corners of the first device die and second device die inside the die group having no adjacent elongated openings in the polymer layer.

19. The package of claim 15, wherein at least one of the plurality of non-elongated openings overlaps the first device die.

20. The package of claim 15, wherein the edge row of the plurality of openings further includes an elongated opening.

* * * * *